(12) United States Patent
Tang

(10) Patent No.: US 11,545,398 B2
(45) Date of Patent: Jan. 3, 2023

(54) SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Poren Tang, Beijing (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/200,989

(22) Filed: Mar. 15, 2021

(65) Prior Publication Data

US 2021/0202322 A1 Jul. 1, 2021

Related U.S. Application Data

(63) Continuation of application No. 16/451,987, filed on Jun. 25, 2019, now Pat. No. 10,978,349.

(30) Foreign Application Priority Data

Jun. 25, 2018 (CN) .......................... 201810661927.8

(51) Int. Cl.
*H01L 21/8234* (2006.01)
*H01L 27/088* (2006.01)
*H01L 21/308* (2006.01)

(52) U.S. Cl.
CPC .... *H01L 21/823431* (2013.01); *H01L 21/308* (2013.01); *H01L 21/823418* (2013.01); *H01L 21/823437* (2013.01); *H01L 21/823468* (2013.01); *H01L 21/823481* (2013.01); *H01L 27/0886* (2013.01)

(58) Field of Classification Search
CPC ..... H01L 21/823431; H01L 21/823821; H01L 29/66795–66818; H01L 29/785–7856; H01L 27/0886; H01L 2029/7857; H01L 2029/7858; H01L 29/6656
See application file for complete search history.

(56) References Cited

U.S. PATENT DOCUMENTS

| | | | |
|---|---|---|---|
| 9,748,245 B1* | 8/2017 | Cheng | H01L 29/41791 |
| 10,163,635 B1 | 12/2018 | Qi et al. | |
| 10,269,932 B1 | 4/2019 | Arya et al. | |
| 2015/0349085 A1 | 12/2015 | Liu et al. | |
| 2017/0207126 A1 | 7/2017 | Ching et al. | |
| 2017/0345933 A1 | 11/2017 | Fung | |
| 2018/0151439 A1* | 5/2018 | Huang | H01L 29/7848 |
| 2019/0288065 A1 | 9/2019 | Cho et al. | |
| 2019/0304984 A1 | 10/2019 | Chang et al. | |

* cited by examiner

Primary Examiner — Eric A. Ward
(74) Attorney, Agent, or Firm — Anova Law Group, PLLC

(57) ABSTRACT

Semiconductor devices is provided. The semiconductor device includes a semiconductor substrate having a first region and an adjacent second region; a plurality of adjacent first fins in the first region of the semiconductor substrate; a plurality of adjacent second fins in the second region of the semiconductor substrate; a first type of fin sidewall spacers; a second type of fin sidewall spacers; first doped layers formed between adjacent first type of fin sidewall spacers in the first region; and second doped layers formed between adjacent first type of fin sidewall spacers in the second region.

8 Claims, 10 Drawing Sheets

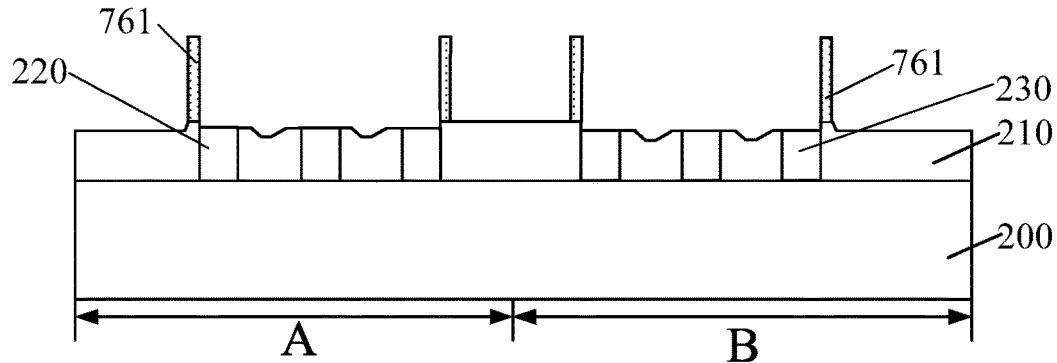

FIG. 28

| | |
|---|---|
| Providing a semiconductor substrate having a first region and a second region; forming a plurality of first fins and a plurality of second fins; forming isolation structures; and forming a first gate structure and a second gate structure | S101 |
| Forming a sidewall spacer material layer | S102 |
| Forming a first mask layer on the sidewall spacer material layer and the isolation structures | S103 |
| Forming third fin portions and fourth fin portions from first fin portions and second fin portions | S104 |
| Removing the first mask layer and forming a second mask layer | S105 |
| Forming third edge fin portions and fourth edge fin portions and forming a first type of fin sidewall spacers | S106 |
| Forming first doped layer and second doped layers | S107 |

FIG. 29

SEMICONDUCTOR DEVICE

CROSS-REFERENCES TO RELATED APPLICATIONS

This application is a continuation application of U.S. patent application Ser. No. 16/451,987, filed on Jun. 25, 2019, which claims the priority of Chinese patent application No. 201810661927.8, filed on Jun. 25, 2018, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

Metal-oxide-semiconductor (MOS) transistors are one of the most important components in modern integrated circuits. The basic structure of an MOS transistor includes a semiconductor substrate, a gate structure on a surface of the semiconductor substrate, and doped source/drain regions in the semiconductor substrate at both sides of the gate structure. The gate structure includes a gate dielectric layer on the surface of the semiconductor substrate, and a gate electrode layer on a surface of the gate dielectric layer.

With the continuous development of the semiconductor technologies, the control capability of the conventional planar MOS transistor to the channel current is weakened; and a severe leakage current is generated. Fin field-effect transistors (FinFETs) are emerging multi-gate devices. An FinFET often includes a fin protruding from the surface of a semiconductor substrate, a gate structure covering portions of the top surface and sidewall surfaces of the fin, and doped source/drain regions formed in the fin at both sides of the gate structure However, there is a need to further improve the performance of the semiconductor device consisting of FinFETs. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor device. The method includes providing a semiconductor substrate having a first region and an adjacent second region; forming a plurality of first fins on the first region of the semiconductor substrate and a plurality of second fins on the second region of the second substrate, wherein each first fin contains a first fin portion and each second fin contains a second fin portion; etching the first fin portions to form third fin portions with top surfaces lower than top surfaces of the first fin portions, wherein a plurality of third fin portions form a third fin portion group; etching the second fin portions to form fourth fin portions with top surfaces lower than top surfaces of the second fin portions, wherein a plurality of fourth fin portions form a fourth fin portion group; forming a first type of fin sidewall spacers and a second type of fin sidewall spacers, wherein the first type of fin sidewall spacers are formed on two sidewall surfaces of the third fin portion group along a width direction of the third fin portions and on two sidewall surfaces of the fourth fin portion group along a width direction of the fourth fin portions, the second type of fin sidewall spacers are formed between adjacent third fin portions and on sidewall surfaces of the third fin portions, between adjacent fourth fin portions and on sidewall surfaces of the fourth fin portions, and top surfaces of the first type of fin sidewall spacers are higher than top surfaces of the second type of fin sidewall spacers, top surfaces of the third fin portions and top surfaces of the fourth fin portions; and forming first doped layers between adjacent first type of fin sidewall spacers in the first region, on the third fin portion group and on the second type of fin sidewall spacers in the first region, and forming second doped layers between the first type of fin sidewall spacers in the second region, on the fourth fin portion group and second type of fin sidewall spacers in the second region, wherein the first doped layers are connected to each other along the width direction of the third fin portions and the second doped layers are connected to each other along the width direction of the fourth fin portions.

Another aspect of the present disclosure includes a semiconductor device. The semiconductor device includes a semiconductor substrate having a first region and an adjacent second region; a plurality of adjacent first fins on the first region of the semiconductor substrate, each first fin containing a third fin portion and a plurality of third fin portions forming a third fin portion group; a plurality of adjacent second fins on the second region of the semiconductor substrate, each second fin containing a fourth fin portion and a plurality of fourth fin portions forming a fourth fin portion group; a first type of fin sidewall spacers formed on two sidewall surfaces of the third fin portion group along a width direction of the third fin portions and on two sidewall surfaces of the fourth fin portion group along a width direction of the fourth fin portions; a second type of fin sidewall spacers formed between adjacent third fin portions and on sidewall surfaces of the third fin portions along the width direction of the third fin portions, and between adjacent fourth fin portions and on sidewall surfaces of the fourth fin portions along the width direction of the fourth fin portions; first doped layers formed between adjacent first type of fin sidewall spacers in the first region, on the third fin portion group and the second type of fin sidewall spacers in the first region, first doped layers on the third fin portions in the first region being connected to each other along the width direction of the third fin portions; and second doped layers formed between adjacent first type of fin sidewall spacers in the second region, and on the fourth fin portion group and the second type of fin sidewall spacers in the second region, second doped layers on the fourth fin portions being connected to each other along the width direction of the fourth fin portions.

Another aspect of the present disclosure includes a method for fabricating a semiconductor device. The method includes providing a semiconductor substrate having a first region and an adjacent second region; forming a plurality of first fins on the first region of the semiconductor substrate and a plurality of second fins on the second region of the semiconductor substrate, wherein each first fin contains a first fin portion and each second fin contains a second fin portion; forming isolation structures covering portions of the sidewall surfaces of the first fin portions and portions of sidewall surfaces of the second fin portions on the first region and the second region of the semiconductor substrate; etching the first fin portions to form third fin portions with top surfaces lower than or level with top surfaces of the first fin portions, wherein a plurality of third fin portions form a third fin portion group; etching the second fin portions to form fourth fin portions with top surfaces lower than or level with top surfaces of the second fin portions, wherein a plurality of fourth fin portions form a fourth fin portion group; forming a first type of fin sidewall spacers on surfaces of the isolation structures and on two sidewall surfaces of the third fin portion group along a width direction of the third fin portions and on two sidewall surfaces of the fourth fin portion group along a width direction of the fourth fin portions; and forming first doped layers between adjacent first type of fin sidewall spacers in the first region and on the third fin portion group, and second doped layers between the first type of fin sidewall spacers in the second region and on the fourth fin portion group, wherein the first doped layers on the third fin portions are connected to each other along the width direction of the third fin portions and the second doped layers on the fourth fin portions are connected to each other along the width direction of the fourth fin portions.

Another aspect of the present disclosure includes a semiconductor device. The semiconductor device includes a semiconductor substrate having a first region and an adjacent second region; a plurality of adjacent first fins on the first region of the semiconductor substrate, each first fin containing a third fin portion and a plurality of third fin portions forming a third fin portion group; a plurality of adjacent second fins on the second region of the semiconductor substrate, each second fin containing a fourth fin portion and a plurality of fourth fin portions forming a fourth fin portion group; a first type of fin sidewall spacers formed on two sidewall surfaces of the third fin portion group along a width direction of the third fin portions and on two sidewall surfaces of the fourth fin portion group along a width direction of the fourth fin portions; isolation structures formed on the first region and the second region of the semiconductor substrate and covering entire sidewall surfaces of the third fin portions and entire sidewall surfaces of the fourth fin portions; a first type of fin sidewall spacers formed on surfaces of the isolation structures and at two sides of the third fin portion group along a width direction of the third fin portions and two sides of the fourth fin portion group along a width direction of the fourth fin portions; first doped layers formed between adjacent first type of fin sidewall spacers in the first region and on the third fin portion group, wherein first doped layers on the third fin portions in the first region are connected with each other along the width direction of the third fin portions; and second doped layers formed between adjacent first type fin sidewall spacers in the second region and on the fourth fin portion group, wherein second doped layers on the fourth fin portions are connected with each other along the width direction of the fourth fin portions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 27-28 illustrate structures corresponding to certain stages during another exemplary fabrication process of a semiconductor device consistent with various disclosed embodiments; and FIG. 29 illustrates an exemplary fabrication process of a semiconductor device consistent with various disclosed embodiments.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
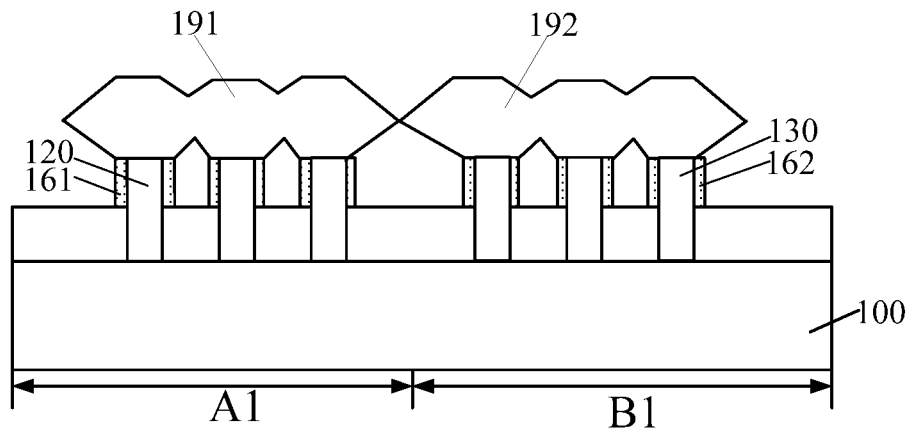
FIG. 1 illustrates a semiconductor device.

FIG. 1 illustrates a semiconductor device. As shown in FIG. 1, the semiconductor device includes a semiconductor substrate 100 having a first region A1 and a second region B1 adjacent to the first region A1. A plurality of adjacent first fins 120a are formed on the first region A1 of the semiconductor substrate 100; and a plurality of adjacent second fins 130 are formed on the second region B1 of the semiconductor substrate 100. Further, the semiconductor device includes a first gate structure across the plurality of first fins 120. The first fins 120 at both sides of the first gate structure are referred to as third fin regions. Further, the semiconductor device includes a second gate structure across the plurality of second fins 130. The second fins 130 at both sides of the second gate structure 130 are referred to as fourth fin regions. Further, the semiconductor device includes first fin sidewall spacers 161 respectively formed on two sidewall surfaces of the third fin regions; and second fin sidewall spacers 162 respectively formed on two sidewall surfaces of the fourth fin regions. Further, the semiconductor device includes first doped layers 191 formed on the third fin regions; and the first doped layers 191 on the third regions are connected to each other along the width direction of the third fin regions. Further, the semiconductor structure includes second doped layers 192 formed on the fourth fin regions. The second doped layers 192 formed on the fourth fin regions are connected to each other along the width direction of the fourth fin regions.

For each of the third fin regions along the width direction of the third fin regions, it is necessary to apply a same operation voltage to the first doped layers 191 on the third fin regions. For each of the fourth fin regions along the width direction of the fourth fin regions, a same operation voltage needs to be applied to the second doped layers 192 on the fourth fin regions to meet the requirements of the process design. With the continuous reduction of the feature size of the semiconductor devices, the distances between adjacent first fins 120 are continuously reduced, and the distances between adjacent second fins 130 are continuously reduced. Therefore, to reduce the process difficulty, the first doped layers 191 on the third fin regions are designed to be connected to each other along the width direction of the third fin regions, and the second doped layers 192 on the fourth fin regions are designed to be connected to each other along the width direction of the fourth fin regions.

To connect the first doped layers 191 to each other along the width direction of the third fin regions, it is necessary to make the height of the first fin sidewall spacers 161 to be lower such that the blocking effect of the first fin sidewall spacers 161 on the growth of the first doped layers 191 is substantially small. To connect the second doped layers 192 to each other along the width direction of the fourth fin regions, it is necessary to make the height of the second fin spacers 162 to be lower such that the blocking effect of the second fin spacers 162 to the growth of the second doped layers 192 is substantially small.

Further, as the feature size of the semiconductor device is continuously reduced, the distance between the first fins 120 and the adjacent second fins 130 is also reduced, and the first doped layers 191 and the second doped layers 192 are easy to connect together. Thus, the requirements of process design may not be met.

The present disclosure provides a semiconductor device and a method for forming a semiconductor device. In the method for forming the semiconductor device, a first type of fin sidewall spacers and a second type of fin sidewall spacers may be formed. The first type of fin sidewall spacers may be formed on the two sidewall surfaces of the third fin portion group along the width direction of the third fin portions, respectively. The second type of fin sidewall spacers may be formed of the two sidewall surfaces of the fourth fin portion group along the width direction of the fourth fin regions, respectively. The second type of fin sidewall spacers may be formed between adjacent third fin regions along the width direction of the third fin regions and on the sidewall surfaces of the third fin regions. The second type of fin sidewall spacers may also be formed between adjacent fourth fin portions along the width direction of the fourth fin portions and on the sidewall surfaces of the fourth fin portions. Top surfaces of the first type of fin sidewall spacers may be higher than top surfaces of the second type of fin sidewall spacers and higher than top surfaces of the third fin portions and the fourth fin portions. Then, first doped layers and second doped layers may be formed. The disclosed method may improve the performance of the semiconductor device.

FIG. 29 illustrates an exemplary fabrication process of a semiconductor device consistent with various disclosed embodiments. FIGS. 2-12 illustrate structures corresponding to certain stages during the exemplary fabrication process of the semiconductor device.

Figure 2:
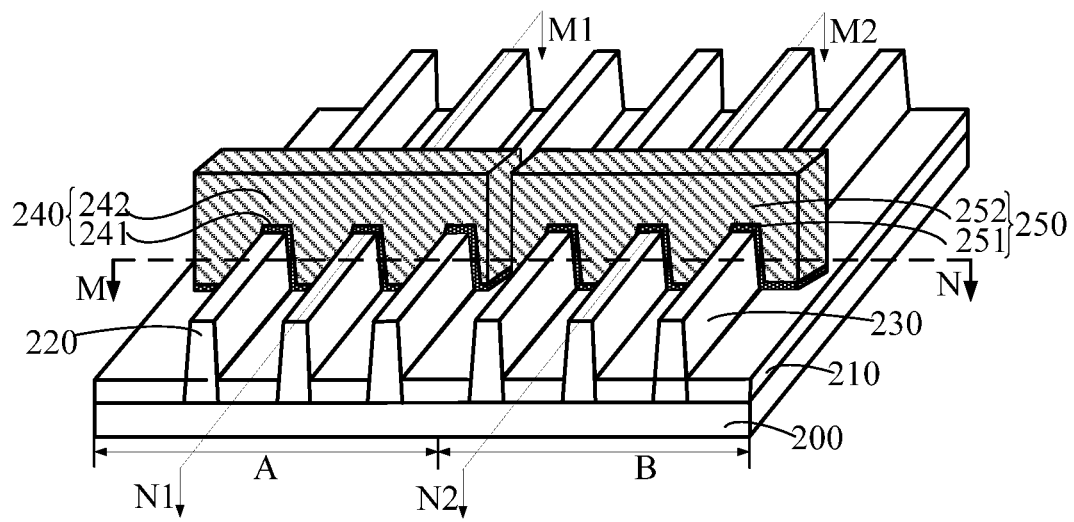
FIGS. 2-12 illustrate structures corresponding to certain stages during an exemplary fabrication process of a semiconductor device consistent with various disclosed embodiments.
Figure 3:
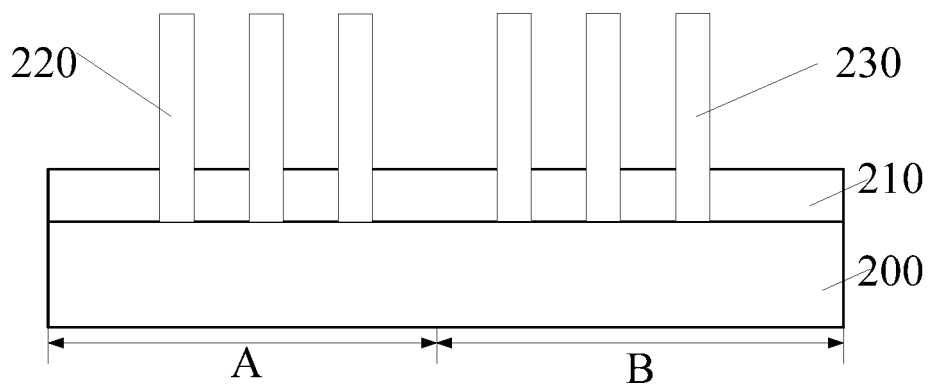
Figure 4:
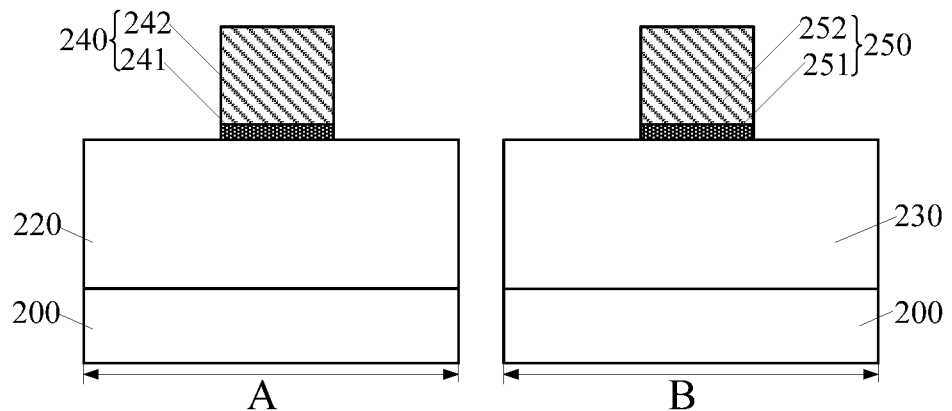

As shown in FIG. 29, at the beginning of the fabrication process, a semiconductor substrate with certain structures is provided (S101). FIGS. 2-4 illustrate a corresponding semiconductor structure. FIG. 3 is an M1-N1-sectional view in the first region of FIG. 2; and FIG. 4 is an M2-N2-sectional view in the second region of FIG. 2.

As shown in FIGS. 2-4, a semiconductor substrate 200 is provided. The semiconductor substrate 200 may include a first region A and an adjacent second region B. A plurality of adjacent first fins 220 may be formed on the first region A of the semiconductor substrate 200; and a plurality of adjacent second fins 230 may be formed on the second region B of the semiconductor substrate 200. Each of the first fins 220 may include a first fin portion; and each of the second fins 230 may include a second fin portion.

The semiconductor substrate 200 may be made of single crystal silicon. The semiconductor substrate 200 may also be made of other semiconductor material, such as polysilicon, amorphous silicon, germanium, silicon germanium, or gallium arsenide, etc. The first region A and the second region B may be used to form semiconductor devices of different functions.

In one embodiment, for illustrative purposes, the first region A and the second region B are both used to form fin field-effect transistors (FinFETs). In some embodiments, the first region may be used to form a triode; and the second region may be used to form a triode.

The distribution direction of the plurality of first fins 220 on the first region A may be perpendicular to the length direction of the first fins 220. The distribution direction of the plurality of second fins 230 on the second region B may be perpendicular to the length direction of the second fins 230. The length direction of the first fins 220 may be parallel to the length direction of the second fins 230. The direction from the center of the first fin 220 to the center of the second fin 230 may be parallel to the distribution direction of the first fins 220 and the distribution direction of the second fins 230.

In one embodiment, isolation structures 210 may be formed on the first region A and the second region B of the semiconductor substrate 200. The isolation structures 210 may cover portions of the sidewall surfaces of the first fins 220 and portions of the sidewall surfaces of the second fins 230. The isolation structures 210 may be made of silicon oxide, etc. The surfaces of the isolation structures 210 may be lower than the top surfaces of the first fins 220 and the top surfaces of the second fins 230.

In one embodiment, the first fin portion may be a portion of the first fin 220, and the top surface of the first fin portion may be the top surface of the first fin 220, and the bottom surface of the first fin portion may be the bottom surface the first fin 220. The second fin portion may be a portion of the second fin 230. The top surface of the second fin portion may be the top surface of the second fin 230; and the bottom surface of the second fin portion may be the bottom surface of the second fin 230.

The isolation structures 210 may cover portions of the sidewall surfaces of the first fin portions and portions of the sidewall surfaces of the second fin portions. The surfaces of the isolation structures 210 may be lower than the top surfaces of the first fin portions and lower than the top surfaces of the second fin portions.

Further, as shown in FIGS. 2-4, a first gate structure 240 may be formed across a plurality of first fins 220 in the first region A; and a second gate structure 250 may be formed across a plurality of second fins 230 in the second region B.

In one embodiment, the first fin portions may be located at two sides of the first gate structure 240; and the second fin portions may be located at two sides of the second gate structure 250.

The first gate structure 240 may also be formed on the surfaces of portions of the isolation structures 210 in the first region A. The first gate structure 240 may include a first gate dielectric layer 241 across the plurality of first fins 220 and a first gate electrode layer 242 on the first gate dielectric layer 241. The first gate dielectric layer 241 may cover portions of the top surfaces and portions of the sidewall surfaces of the first fins 220. The second gate structure 250 may also be formed on the surfaces of portions of the isolation structures 210 in the second region B. The second gate structure 250 may include a second gate dielectric layer 251 across the plurality of second fins 230 and a second gate electrode layer 252 on the second gate dielectric layer 251. The second gate dielectric layer 251 may cover portions of the top surfaces and portions of the sidewall surfaces of the second fins 230. The first gate dielectric layer 241 and the second gate dielectric layer 251 may be made of silicon oxide, etc.; and the first gate electrode layer 242 and the second gate electrode layer 252 may be made of polysilicon, etc.

The plurality of first fin portions in the first region A may form a first fin portion group; and the first fin portions 220 at the two edge regions of the first fin portion group along the width direction of the first fin portions may be referred to as the first edge fin portions. The plurality of second fin portions in the second region B may form a second fin portion group; and the second fin portions 230 at the two edge regions of the second fin portion group along the width direction of the second fin portions 230 may be referred to as second edge fin portions.

Among the plurality of first fins 220 and along the width direction of the first fins 220, only two first fins 220 at the edge regions may be the first edge fin portions. Among the plurality of second fins 230 and along the width direction of the second fins 230, only two second fins 230 at the edge regions may be the second edge fin portions.

Then, the first fin portions may be etched to form third fin portions, the top surfaces of the third fin portions may be lower than the top surfaces of the first fin portions. The plurality of third fin portions may form a third fin portion group. Further, the second fin portions may be etched to forms fourth fin portions. The top surfaces of the fourth fin portions may be lower than the top surfaces of the second fin portions. The plurality of fourth fin portions may form a fourth fin portion group.

Further, a first type of fin sidewall spacers and a second type of fin sidewall spacers may be formed. Along the width direction of the third fin portions, the first type of fin sidewall spacers may be formed on both sidewall surfaces of the third fin portion group, respectively. Along the width direction of the fourth portion, the first type of the fin sidewall spacers may be formed on both sidewall surfaces of the fourth fin portion group, respectively. Along the width direction of the third fin portion, the second type of fin sidewall spacers may be formed between adjacent third fin portions and on the sidewall surfaces of the third fin portions. Along the width direction of the fourth fin portions, the second type of fin sidewall surfaces may also be formed between adjacent fourth fin portions and on the sidewall surfaces of the fourth fin portions. Top surfaces of the first type of fin sidewall spacers may be higher than top surfaces of the second type of fin sidewall spacers; and higher than top surfaces of the third fin portions and the fourth fin portions.

Along the width direction of the third fin portions, the third fin portions at the two edge regions of the third fin portion group may be referred to as the third edge fin portions. Along the width direction of the fourth fin portions, the fourth fin portions at two edge regions of the fourth fin portion group may be referred to as the fourth edge fin portions. The third edge fin portions may be formed by etching the first edge fin portions; and the fourth edge fin portions may be formed by etching the second edge fin portions.

In one embodiment, the number of the first fins 220 in the first region A is greater than or equal to three; and the number of the second fins 230 in the second region B is greater than or equal to three. Correspondingly, the first fin portion group may further include first middle fin portions; and the first middle fin portions may refer to the first fin portions located between the first edge fin portions along the width direction of the first fins 220. The second fin portion group may further include second middle fin portions, and the second middle fin portions may refer to the second fin portions located between the second edge fin portions along the width direction of the second fins 230. The third fin portion group may further include third middle fin portions, and the third middle fin portions may refer to the third fin portions located between the third edge fin portions along the width direction of the third fin portions. The fourth fin portion group may further include fourth middle fin portions; and the fourth middle fin portions may refer to the fourth fin portions located between the fourth edge fin portions along the width direction of the fourth fin portions. The third middle fin portions may be formed by etching the first middle fin portions; and the fourth middle fin portions may be formed by etching the second middle fin portions.

In some embodiments, the number of first fins in the first region A may be two, and the number of second fins in the second region B may be two. When the number of the first fins in the first region A is two, there may be no first middle fin portion in the first fin portion group, and no third middle fin portion in the third fin region group. When the number of the second fins in the second region B is two, there may be no second middle fin portion in the second fin portion group, and no fourth middle fin portion in the fourth fin portion group.

In one embodiment, before etching the first fin portions and the second fin portions, a sidewall spacer material layer may be formed on the surfaces of the isolation structures 210 in the first region A and the second region B, the sidewall surfaces and the top surfaces of the first fin portions, and the sidewall surfaces and the top surfaces of the second fin portions. A differential process may be performed on the sidewall spacer material layer to form a first type of fin sidewall spacers and a second type of fin sidewall spacers. The differential process may be performed during etching the first fin portions to form the third fin portions and during etching the second fin portions to form the fourth fin portions.

Figure 5:
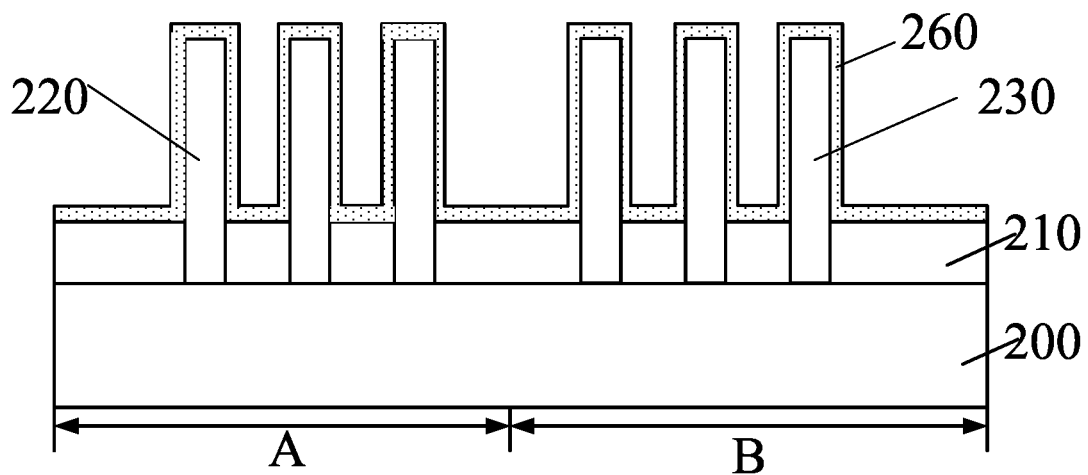
Figure 6:
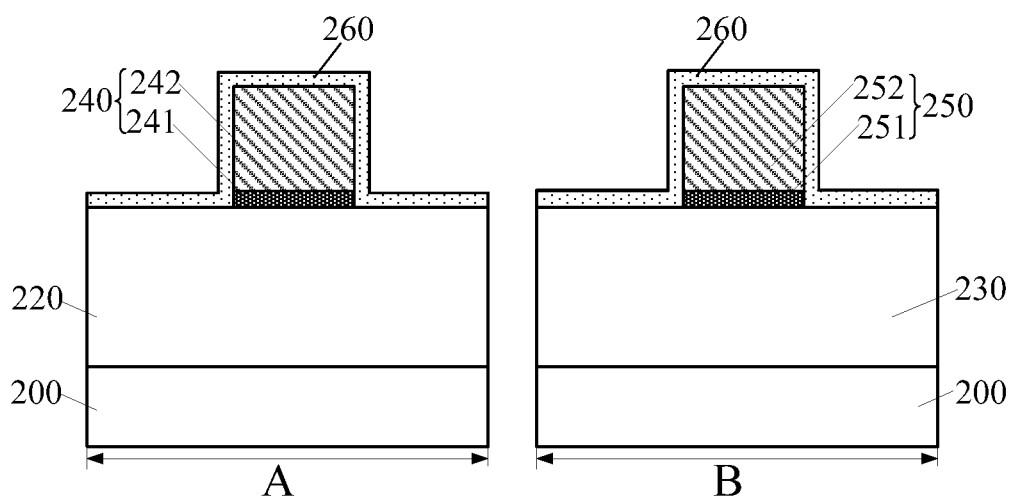

Returning to FIG. 29, after forming the first gate structure and the second gate structure, a sidewall spacer material layer may be formed (S102). FIGS. 5-6 illustrate a corresponding semiconductor structure. FIG. 5 is a schematic view based on FIG. 3; and FIG. 6 is a schematic view based on FIG. 4.

As shown in FIGS. 5-6, a sidewall spacer material layer 260 is formed on the surfaces of the isolation structures 210 in the first region A and the second region B, the sidewall surfaces and the top surfaces of the first fin portions, and the sidewall surfaces and the top surfaces of the second fin portions.

In one embodiment, the sidewall spacer material layer 260 may be formed on the surfaces of the isolation structures 210 in the first region A and the second region B, the sidewall surfaces and the top surfaces of the first fin portions, and the sidewall surfaces and the top surfaces of the second fin portions. The sidewall spacer material layer 260 may also be formed on the top and sidewall surfaces of the first gate structure 240 and the top and sidewall surfaces of the second gate structure 250.

The sidewall spacer material layer 260 may be used to subsequently form a first type of fin sidewall spacers and a second type of fin sidewall spacers. In one embodiment, the sidewall spacer material layer 260 may also be used to form first gate sidewall spacers and second gate sidewall spacers.

The sidewall spacer material layer 260 may be made of silicon nitride, etc. The process for forming the sidewall spacer material layer 260 may include a deposition process, such as an atomic layer deposition (ALD) process, or a plasma-enhanced chemical vapor deposition (PECVD) process, etc.

Figure 7:
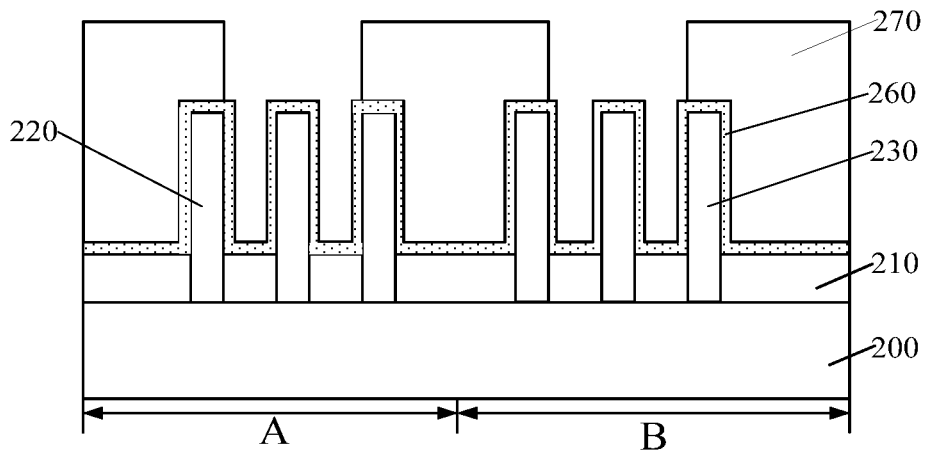

Returning to FIG. 29, after forming the sidewall spacer material layer, a first mask layer may be formed (S103). FIG. 7 illustrates a corresponding semiconductor structure. FIG. 7 is a schematic view based on FIG. 5.

As shown in FIG. 7, a first mask layer 270 may be formed on the isolation structures 210 and the sidewall spacer material layer 260. The first mask layer 270 may cover the sidewall spacer material layer 206 on both sidewall surfaces of the first fin portion group along the width direction of the first fins 220, the sidewall spacer material layer 260 on the top surfaces of the first edge fin portions, the sidewall spacer material layer 206 on both sidewall surfaces of the second fin portion group along the width direction of the second fins 220, and the sidewall spacer material layer 260 on the top surfaces of the second edge fin portions. Further, the first mask layer 270 may expose the sidewall spacer material layer 260 between the first edge fin portions along the width direction of the first fin 220 and the sidewall spacer material layer 260 between the second edge fin portions along the width direction of the second fins 230.

The first mask layer 270 may be made of any appropriate material. In one embodiment, the first mask layer 270 is made of a photoresist material.

Figure 8:
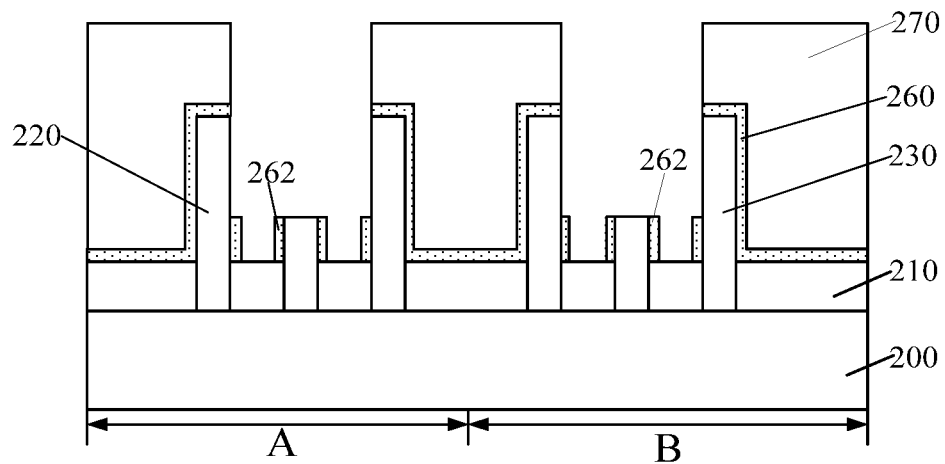

Returning to FIG. 29, after forming the first mask layer 270, third middle fin portions and fourth middle fin portions may be formed (S104). FIG. 8 illustrates a corresponding semiconductor structure.

As shown in FIG. 8, the first middle fin portions and the second middle fin portions may be etched by using the first mask layer 270 as an etching mask to form third middle fin portions from the first middle fin portions, and form fourth middle fin portions from the second middle fin portions. During etching the first middle fin portions and the second middle fin portions, by using the first mask layer 270 as an etching mask, a second type of fin sidewall spacers 262 may be formed from the sidewall spacer material layer 260 between the first edge fin portions along the width direction of the first fin portions and the sidewall spacer material layer 260 between second edge fin portions along the width direction of the second fin portions.

Various processes may be used to etch the first middle fin portions, the second fin portions and the sidewall spacer material layer 260. In one embodiment, an anisotropic dry etching process is used to etch the first middle fin portions, the second middle fin portions, and the sidewall spacer material layer 260 using the first mask layer 270 as the etching mask.

The second type of fin sidewall spacers 262 may be located between the adjacent third fin portions along the width direction of the third fin portions and on the sidewall surfaces of the third fin portions. The second type of fin sidewall spacers 262 may also be located between the adjacent fourth fin portions along the width direction of the fourth fin portions and on the sidewall surfaces of the fourth fin portions. In particular, in one embodiment, the second type of fin sidewall spacers 262 may be located on both sidewall surfaces of the third middle fin portions and both sidewall surfaces of the fourth middle fin portions. The second type of fin sidewall spacers 262 may also be located on the sidewall surfaces of the third edge fin portions adjacent to the third middle fin portions and the sidewall surfaces of the fourth edge fin portions adjacent to the fourth middle fin portions.

Figure 9:
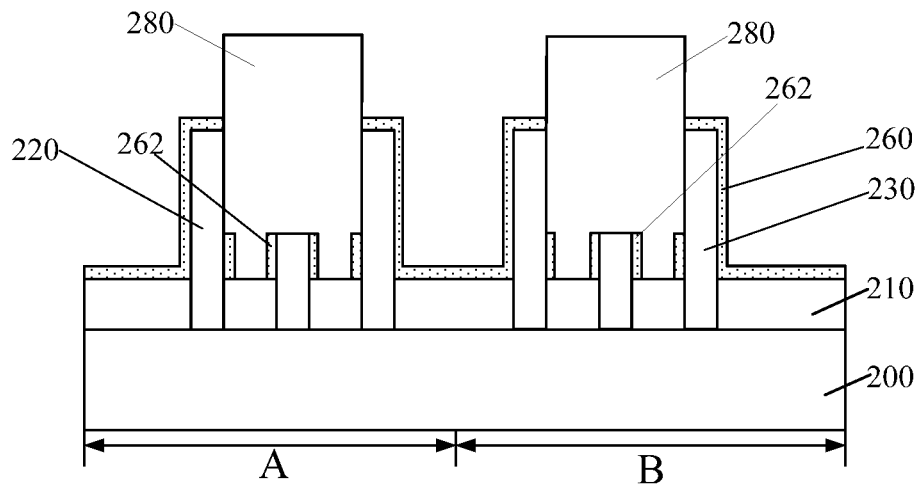

Returning to FIG. 29, after forming the second type of sidewall spacers, a second mask layer may be formed (S105). FIG. 9 illustrates a corresponding semiconductor structure.

As shown in FIG. 9, after forming the second type of fin sidewall spacers 262, the third middle fin portions and the fourth middle fin portions, the first mask layer 270 may be removed (refer to FIG. 8). After removing the first mask layer 270, a second mask layer 280 may be formed on the isolation structures 210, the third middle fin portions, the fourth middle fin portions, and the second type of fin sidewall spacers 262. The second mask layer 280 may expose the sidewall spacer material layer 260 on the sidewall surfaces of the first edge fin portions away from the third middle fin portions, the sidewall spacer material layer 260 on the top surfaces of the first edge fin portions, and the sidewall spacer material layer 206 on the sidewall surfaces of the fourth middle fin portions away from the second edge fin portions, and the sidewall spacer material layer 260 on the top surfaces of the second edge fin portions.

The second mask layer 280 may be made of any appropriate material. In one embodiment, the second mask layer 280 is made of a photoresist material.

Figure 10:
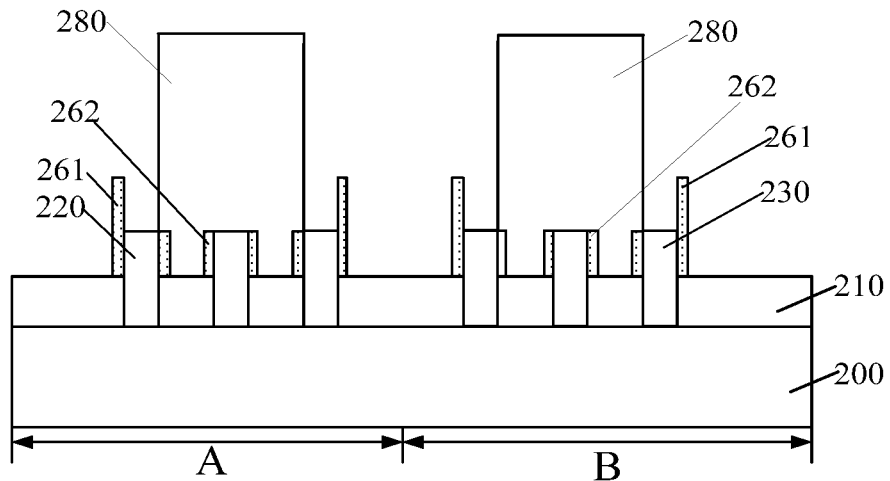

Returning to FIG. 29, after forming the second mask layer, third edge fin portions, fourth edge fin portions and a first type of sidewall spacers may be formed (S106). FIG. 10 illustrates a corresponding semiconductor structure.

As shown in FIG. 10, the first edge fin portions and the second edge fin portions may be etched using the second mask layer 280 as an etching mask to form third edge fin portions from the first edge fin portions, and the fourth edge fin portions from the second edge fin portions, respectively. During etching the first edge fin portions and the second edge fin portions using the second mask layer 280 as the etching mask, the second mask layer 280 may also be used as an etching mask to etch the sidewall material layer 260 to form first type of sidewall spacers 261 from the sidewall spacer material layer 260 located on the sidewall surfaces of the first edge fin portions away from the third middle fin portions, and the sidewall material layer 260 located on the sidewall surfaces of the second edge fin portions away from the fourth fin portions.

The first edge fin portions and the second edge fin portions may be etched by any appropriate process using the second mask layer 280 as the etching mask, such as an anisotropic dry etching process, etc. The sidewall spacer material layer 260 may be etched by any process using the second mask layer 280 as the etching mask, such as an anisotropic dry etching process, etc.

Along the width direction of the third fin portions, the first type of fin sidewall spacers 261 may be respectively located at both sidewall surfaces of the third fin portion group. Along the width direction of the fourth fin portions, the first type of fin sidewall spacers 261 may also be respectively located at both sidewall surfaces of the fourth fin portion group. The top surfaces of the first type of fin sidewall spacers 261 may be higher than the top surfaces of the second type of fin sidewall spacers 262 and higher than the top surfaces of the third fin portions and the fourth fin portions. In one embodiment, the first type of fin sidewall spacers 261 are located on the sidewall surfaces of the third edge fin portions facing away from the third middle fin portions, and sidewall surfaces of the fourth edge fin portions facing away from the fourth middle fin portions. The top surfaces of the first type of fin sidewall spacers 261 may be higher than the top surfaces of the third edge fin portions and the top surfaces of the fourth edge fin portions.

After forming the third fin portions and the fourth fin portions, the isolation structures 210 may cover portions of the sidewall surfaces of the third fin portions and portions of the sidewall surfaces of the fourth fin portions. The surfaces of the isolation structures 210 may be lower than the top surfaces of the third fin portions and lower than the top surfaces of the fourth fin portions. The first type of fin sidewall spacers 261 and the second type of fin sidewall surfaces 262 may also be formed on the surfaces of the isolation structures 210.

In one embodiment, after forming the third fin portions and the fourth fin portions, the third fin portions may be located at two sides of the first gate structure 240; and the fourth fin portions may be located at two sides of the second gate structure 250.

The distance from the top surface of the first type of fin sidewall spacers 261 to the top surfaces of the third fin portions may be in a range of approximately 2 nm-30 nm. The distance from the top surfaces of the first type of fin sidewall spacers 261 to the top surfaces of the fourth fin portions may be in a range of approximately 2 nm-30 nm. When the distance from the top surfaces of the first type of fin sidewall spacers 261 to the top surfaces of the third fin portions is too small; and the distance from the top surfaces of the first type of fin sidewall spacers 261 to the top surfaces of the fourth fin portions is too small, the ability of the first type of fin sidewall spacers 261 to isolate subsequently formed first doped layers and second doped layers may be reduced.

The top surfaces of the second type of fin sidewall spacers 262 may level with the top surfaces of the third fin portions; and the top surfaces of the second type of fin sidewall spacers 262 may level with the top surfaces of the fourth fin portions. In some embodiments, the top surfaces of the second type of fin sidewall spacers 262 may be lower than the top surfaces of the third fin portions, and the top surfaces of the second type of fin sidewall spacers 262 may be lower than the top surfaces of the fourth fin portions.

In one embodiment, the heights of all the third fin portions may be the same; and the heights of all the fourth fin portions may be the same.

In one embodiment, during forming the first type of fin sidewall spacers 261 and the second type of fin sidewall spacers 262, first gate sidewall spacers (not shown) may be formed on the sidewall surfaces of the first gate structure 240; and second gate sidewall spacers (not shown) may be formed on the sidewall surfaces of the second gate structure 250. Both the first gate sidewall spacers and the second gate sidewall spacers may be formed by etching the sidewall spacer material layer 260.

Figure 11:
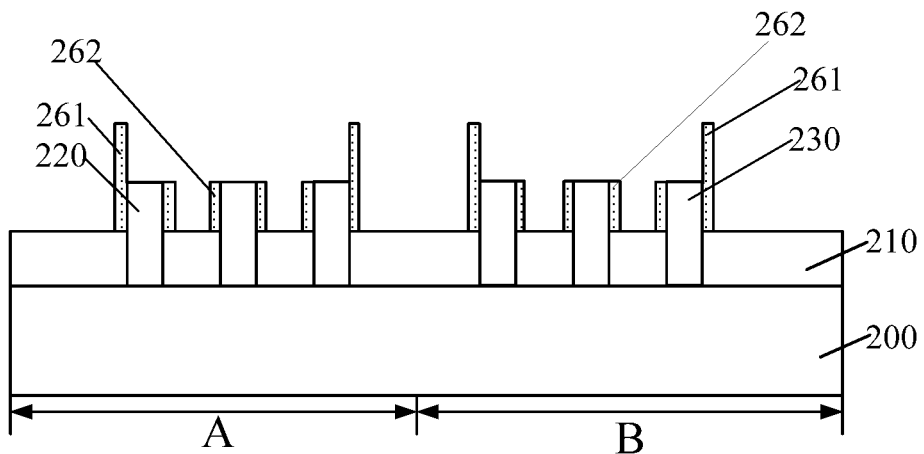

After forming the first type of fin sidewall spacers 261, as shown in FIG. 11, the second mask layer 280 may be removed.

Figure 12:
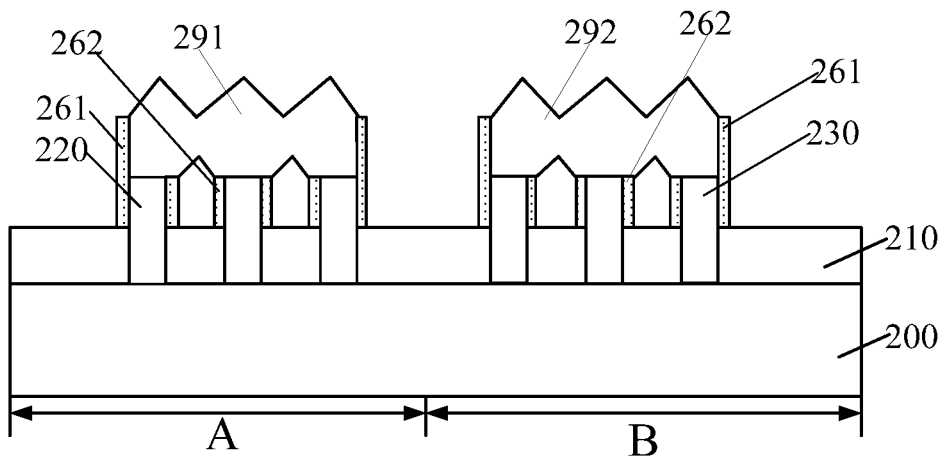

Returning to FIG. 29, after forming the first type of fin sidewall spacers, first doped layers and second doped layers may be formed (S107). FIG. 12 illustrates a corresponding semiconductor structure.

As shown in FIG. 12, first doped layers 291 may be formed between the first type of fin sidewall spacers 261 in the first region A. The first doped layers 291 may be formed on the third fin portion group and the second type of fin sidewall spacers 262 in the first region A. During forming the first doped layers 291, second doped layers 292 may be formed between the first type of fin sidewall spacers 261 in the second region B. The second doped layers 292 may be formed on the fourth fin portion group and the second sidewall spacers 262 in the second region B. Along the width direction of the third fin portions, the first doped layers 291 on the third fin portions may be connected to each other. Along the width direction of the fourth fin portions, the second doped layers 292 on the fourth fin portions may be connected to each other.

Various processes may be used to form the first doped layers 291 and the second doped layers 292, such as an epitaxial growth process, etc. The first doped layers 291 and the second doped layers 292 may be made of silicon doped with P-type ions. In some embodiments, the first doped layers 291 and the second doped layers 292 may also be made of silicon carbide doped with N-type ions, or silicon doped with N-type ions, etc.

For each of the third fin portions along the width direction of the third fin portions, it may be necessary to apply a same operating voltage on the first doping layers 291 on the third fin portions. For each of the fourth fin portions along the width direction in the fourth fin portions, a same operating voltage needs to be applied on the second doped layers 292 on the fourth fin portions to meet the requirements of the process design. As the feature size of the semiconductor device continues to decrease, the distance between adjacent first fins 220 may decrease, and the distance between adjacent second fins 230 may decrease. Thus, to reduce the process difficulty, the first doped layers 291 on the third fin portions may be designed to be connected to each other along the width direction of the third fin portions; and the second doped layers 292 on the fourth fin portions may be designed to be connected to each other along the width direction of the fourth fin portions.

In one embodiment, the first doped layers 291 may be located at both sides of the first gate structure 240 and the first gate sidewall spacers. The second doped layers 292 may be located at both sides of the second gate structure 250 and the second gate sidewall spacers.

When the first region A is used to form fin field-effect transistors (FinFETs), in one embodiment, the first doped layers 291 on the third fin portions may be connected to each other along the width direction of the third fin portions. For such a structure, the first doped layers 291 may have a substantially large total volume. Thus, the stress applied to the channel in each of the first fins 220 by the first doped layer 291 may be substantially large. Accordingly, the carrier mobility in the channels in the first fins 220 may be increased.

When the second region B is used to form the FinFETs, in one embodiment, the second doped layer 292 on the fourth fin portions may be connected to each other along the width direction of the fourth fin portions. For such a structure, the second doped layers 292 may have a substantially large total volume. Thus, the stress applied to the channel in each of the second fins 230 by the second doped layer 292 may be substantially large. Thus, the carrier mobility in the channels in the second fins 230 may be increased.

In one embodiment, the top surfaces of the second type of fin sidewall spacers 262 may be lower than the top surfaces of the first type of fin sidewall spacers 261. Thus, in the first region A, the blocking effect of the second type of fin sidewall spacers 262 to the growth of the first doped layers 291 may be substantially small; and it may facilitate the connections of the first doped layers 291 along the width direction of the third fin portions. In the second region B, the blocking effect of the second type of fin sidewall spacers 262 to the growth of the second doped layers 292 may be substantially small; and it may facilitate the connection of the second doped layers 292 along the width direction of the fourth fin portions.

In one embodiment, because the first type of fin sidewall spacers 261 may be formed, during forming the first doped layers 291 and the second doped layers 292, the first type of fin sidewall spacers 261 in the first region A may limit the growth space of the first doped layers 291; and the first type of fin sidewall spacers 261 in the second region B may limit the growth space of the second doped layers 292. Accordingly, the first type of fin sidewall spacers 261 having a higher height may isolate the first doped layers 291 from the second doped layers 292; and the connection between the first doped layers 291 and the second doped layers 292 may be prevented.

In one embodiment, because the first type of fin sidewall spacers 261 in the first region A may limit the growth space of the first doped layers 291, the first doped layers 291 may be uniformly distributed along the width direction of the third fin portions. Accordingly, the insufficient growth of the first doped layers 291 on the middle fin portions along the width direction of the third fin portions may be prevented. Thus, the first doped layers 291 may be uniformly distributed along the width direction of the third fin portions. Similarly, the second doped layers 292 may be uniformly distributed along the width direction of the fourth fin portions.

In one embodiment, the first doped layers 291 may be uniformly distributed along the width direction of the third fin portions. Thus, the difference in stress in the channels of different first fin portions 220 may be substantially small. The second doped layers 292 may be uniformly distributed along the width direction of the fourth fin portions. Thus, the difference in stress in the channels of different second fins 230 may be substantially small.

The present disclosure also provides a semiconductor device. FIG. 12 illustrates a corresponding semiconductor device.

As shown in FIG. 12, the semiconductor device may include a semiconductor substrate 200 having a first region A and an adjacent second region B. A plurality of adjacent first fins 220 may be formed on the first region A of the semiconductor substrate 200. Each of the first fins 220 may include a third fin portion; and a plurality of third fin portions may form a third fin portion group. The semiconductor device may also include a plurality of adjacent second fins 230 formed on the second region B of the semiconductor substrate 200. Each of the second fins 230 may include a fourth fin portion; and the plurality of fourth fin portions may form a fourth fin portion group. Further, the semiconductor device may include a first type of fin sidewall spacers 261 formed at two sidewall surfaces of the third fin portion group along the width direction of the third fin portions, and the two sidewall surfaces of the fourth fin portion group along the width direction of the fourth fin portions. Further, the semiconductor device may include a second type of fin sidewall spacers 262 formed between the adjacent third fin portions along the width direction of the third fin portions and on the sidewall surfaces of the third fin portions, and also formed between the adjacent fourth fin portions along the width direction of the fourth fin portions and on the sidewall surfaces of the fourth fin portions. The top surfaces of the first type of fin sidewall spacers 261 may be higher than the top surfaces of the second type of fin sidewall spacers 262 and higher than the top surfaces of the third fin portions and the fourth fin portions. Further, the semiconductor device may include first doped layers 291 formed between the adjacent first type of fin sidewall spacers 261 in the first region A. The first doped layers 291 may be formed on the second type of sidewall spacers 262 on the third fin portion group and in the first region A; and the first doped layers 291 on the third fin portions may be connected to each other along the width direction of the third fin portions. Further, the semiconductor device may include a second doped layers 292 formed between the first type of fin sidewall spacers 261 in the second region B. The second doped layers 292 may be formed on the second type of fin sidewall spacers 262 on the fourth fin portion group and in the second region B; and the second doped layers 292 on the fourth fin portions may be connected to each other along the width direction of the fourth fin portions. The detailed structures and intermediate structures are described above with respect to the fabrication processes.

FIGS. 13-16 illustrate semiconductor structure corresponding to certain stages during another exemplary fabrication process of a semiconductor device consistent with various disclosed embodiments. Comparing with the previously described embodiments, the major differences may include that the first fin portions may be etched to form the third fin portions; the second fin portions may be etched to form fourth fin portions; and a differential process may be performed.

Figure 13:
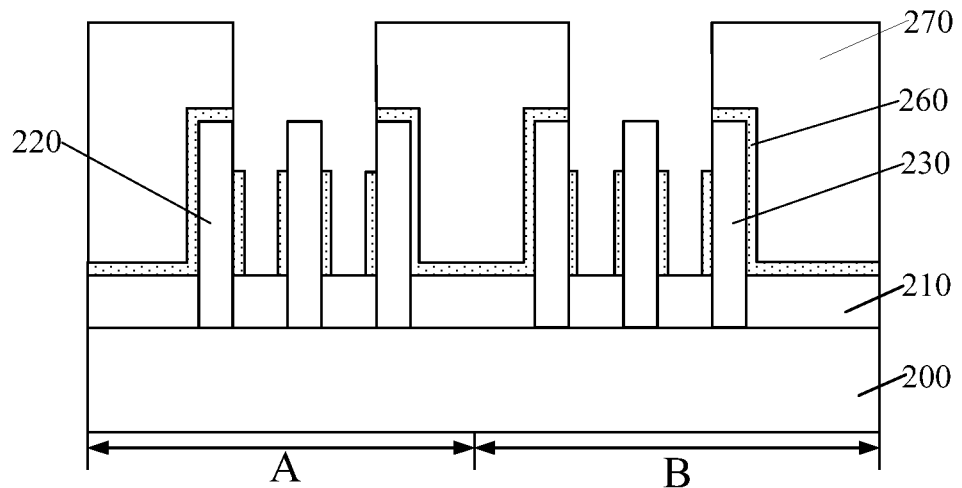
FIGS. 13-16 illustrate structures corresponding to certain stages during another exemplary fabrication process of a semiconductor device consistent with various disclosed embodiments.

FIG. 13 is a schematic diagram based on FIG. 7. As shown in FIG. 13, the sidewall spacer material layer 260 may be etched using the first mask layer 270 as a mask to cause the top surfaces of the sidewall spacer material layer 260 between the first edge fin portions along the width direction of the first fin portions to be lower than the top surfaces of the first middle fin portions; and cause the top surface of the sidewall spacer material layer 260 between the second edge fin portions along the width direction of the second fin portions to be lower than the top surfaces of the second middle fin portions.

The process for etching the sidewall spacer material layer 260 with the first mask layer 270 as an etching mask may include an anisotropic dry etching process, etc. During the etching process, the etching selectivity ratio between the sidewall spacer material layer 260 and the first fin portions may be substantially high. In particular, the etching selectivity ratio may be greater than 100. The etching selectivity ratio between the sidewall spacer material layer 260 and the second fin portions may also be substantially high. In particular, the etching selectivity ratio may be greater than 100. Thus, the etching process may have less consumption to the first middle fin portions and the second middle fin portions. Accordingly, the heights of the subsequently formed third fin portions may be substantially uniform; and the heights of the subsequently formed fourth fin portions may be substantially uniform.

Figure 14:
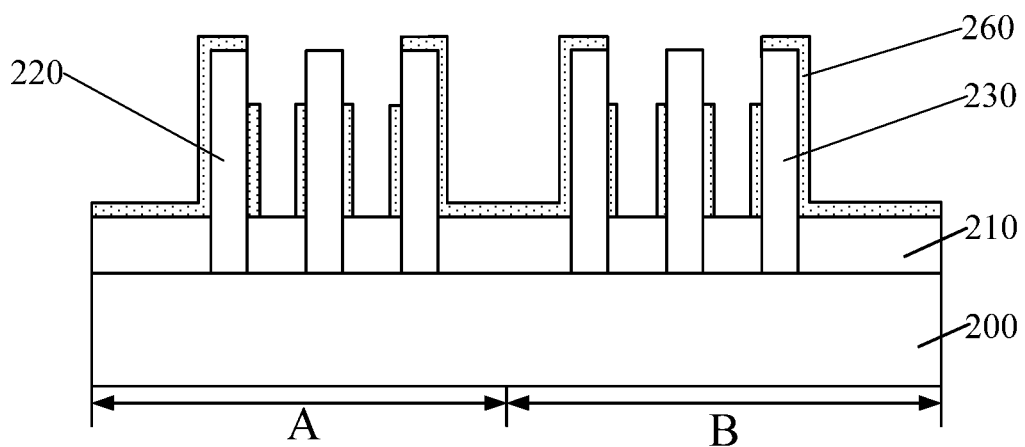

Further, as shown in FIG. 14, after etching the sidewall spacer material layer 260, the first mask layer 270 may be removed.

Figure 15:
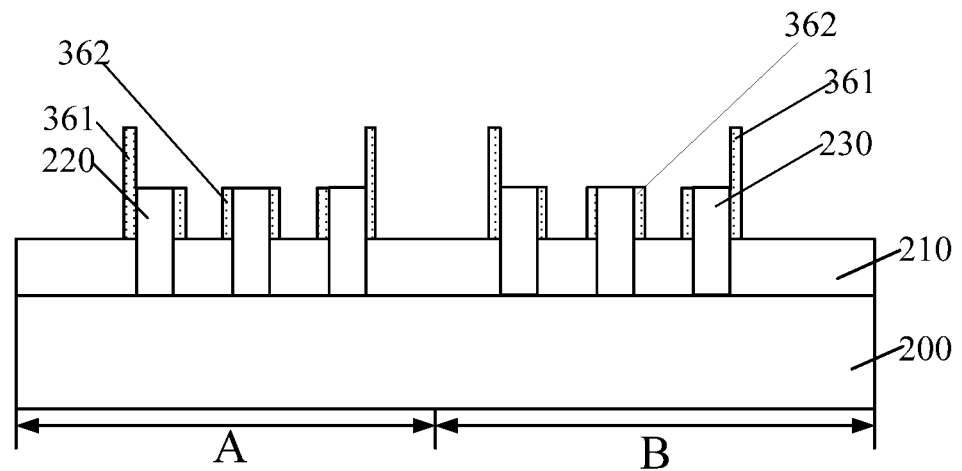

Further, as shown in FIG. 15, after removing the first mask layer 270, the first fin portions and the second fin portions may be etched to form third fin portions from the first fin portions; and form fourth fin portions from the second fin portions. After removing the first mask layer 270 and during etching the first fin portions and the second fin portions, the remaining sidewall spacer material layer 260 may be etched to form a first type of fin sidewall spacers 361 and a second type of fin sidewall spacers 362.

The process for etching the first fin portions and the second fin portions may include an anisotropic dry etching process, etc. The process for etching the remaining sidewall spacer material layer 260 may include an anisotropic dry etching process, etc.

In one embodiment, the process for etching the first fin portions and the second fin portions and the process for etching the remaining sidewall material layer 260 may be performed in one etching process. Accordingly, the process may be simplified. The etch rate of the one etching process to the sidewall spacer material layer 260 may be smaller than the etch rate to the first fin portions and the second fin portions.

The positions of the first type of fin sidewall spacers 361 may refer to the previous embodiments. The positions of the second type of fin sidewall spacers 362 may refer to the previous embodiments.

Figure 16:
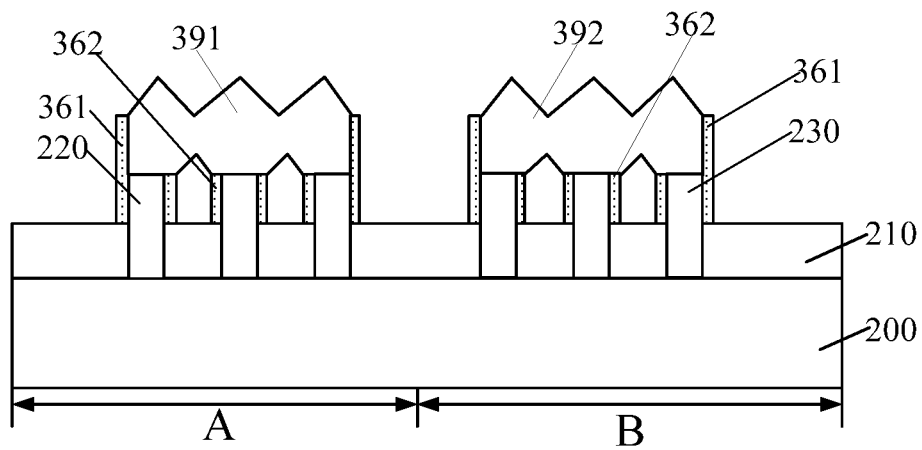

Further, as shown in FIG. 16, after forming the first type of fin sidewall spacers 361 and the second type of fin sidewall spacers 362, first doped layers 391 may be formed between the first type of fin sidewall spacers 361 in the first region A. The first doped layers 391 may also be formed on the sidewall spacers 362 in the third fin portion group and in the first region A. During forming the first doped layers 391, second doped layers 392 may also be formed between the adjacent first type of fin sidewall spacers 361. The second doped layers 392 may also be formed on the second type of fin sidewall spacers 362 on the fourth fin portion group and in the second region B. Along the width direction the of the third fin portions, the first doped layers 391 on the third fin portions may be connected to each other. Along the width direction of the third fin portions, the second doped layer 392 on the fourth fin portions may be connected to each other.

Correspondingly, the present disclosure provides another semiconductor device.

An exemplary semiconductor may be referred to FIG. 16.

Figure 17:
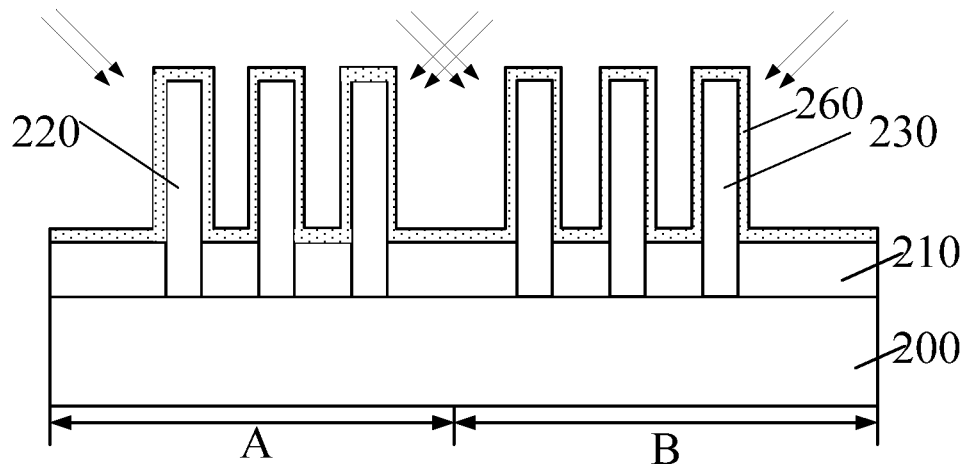
FIGS. 17-19 illustrate structures corresponding to certain stages during another exemplary fabrication process of a semiconductor device consistent with various disclosed embodiments.
Figure 18:
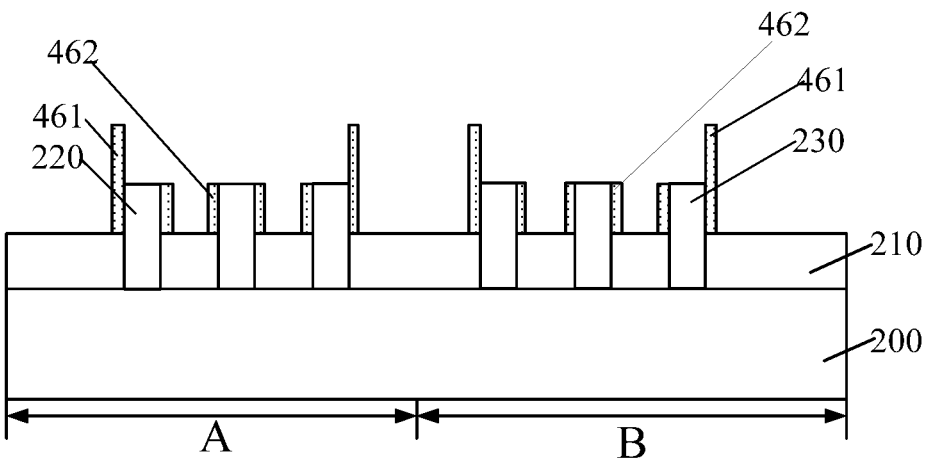
Figure 19:
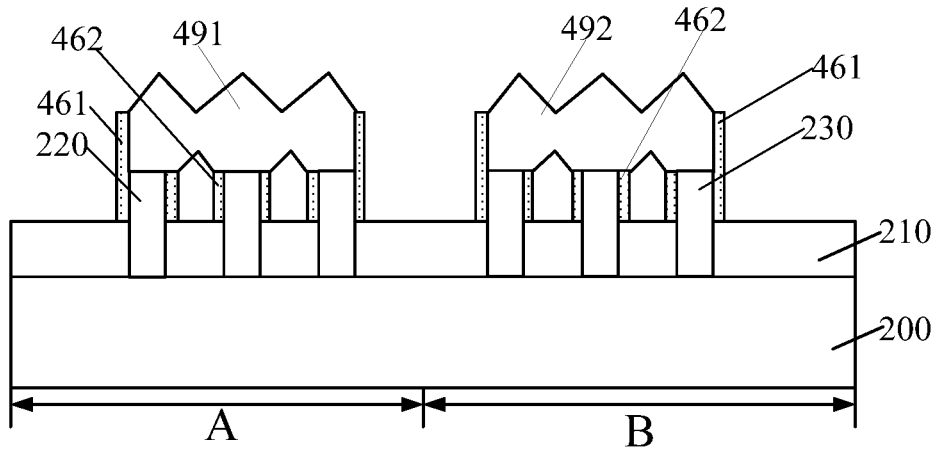

FIGS. 17-19 illustrate semiconductors corresponding to certain stages during another exemplary fabrication process of a semiconductor device consistent with various disclosed embodiments. Comparting with previous embodiments, the process for etching the first fin portions to form the third fin portion group, the process for etching the second fin portions to form the fourth fin portion group and the differential process may be different.

FIG. 17 is a schematic view based on FIG. 5. As shown in FIG. 17, an ion implantation process may be performed on the sidewall spacer material layer 260 on both sidewall surfaces of the first fin portion group along the width direction of the first fin portions, and on the sidewall spacer material layer 260 on both sidewall surfaces of the second fin portion group along the width direction of the second fin portions.

The ions of the ion implantation process may include carbon ions, or oxygen ions, etc.

The implanting direction of the ion implantation process may be inclined at an certain angle to the sidewall surfaces of the first fin portions. Due to the blocking effect of the first fin portion group, the sidewall spacer material layer 260 between the adjacent first fin portions along the width direction of the first fin portions may be implanted with less ions. Only top portions of the sidewall spacer material layer 260 between the adjacent first fin portions may be implanted with the ions. The implanting direction of the ion implantation process may be inclined at an certain angle to the sidewall surfaces of the second fin portions. Due to the blocking effect of the second fin portion group, the sidewall spacer material layer 260 between the adjacent first fin portions along the width direction of the first fin portions may be implanted with less ions. Only top portions of the sidewall spacer material layer 260 between the adjacent second fin portions may be implanted with the ions.

Further, as shown in FIG. 18, after the ion implantation process, the sidewall spacer material layer 260 may be etched. The etching rate to the portions of the sidewall material layer 260 implanted with the ions may be lower than the etching rate to the portions of the sidewall spacer material layer 260 without being implanted with the ions. After the etching process, the sidewall spacer material layer 260 may form a first type of fin sidewall spacers 461 and a second type of fin sidewall spacers 462. After the ion implantation process and during etching the sidewall spacer material layer 260, the first fin portions and the second fin portions may be etched such that third fin portions may be formed from the first fin portions, and fourth fin portions may be formed from the second fin portions.

The positions, material and heights of the first type of fin sidewall spacers 461 may be referred to the previous embodiments. The positions, material and heights of the second type of fin sidewall spacers 462 may be referred to the previous embodiments.

Further, as shown in FIG. 19, after forming the third fin portions and the fourth fin portions, first doped layers 491 may be formed between the first type of fin sidewall spacers 461 in the first region A. The first doped layers 491 may be formed on the second type of fin sidewall spacers 462 on the third fin portion group and in the first region A. During forming first doped layers 491, second doped layers 492 may be formed between the first type of fin sidewall spacers 461 in the second region B. The second doped layers 492 may be formed on the second type of fin sidewall spacers 462 on the fourth fin portion group and in the second region B. The first doped layers 491 on the third doped regions may be connected to each other along the width direction of the third fin portions. The second doped layers 492 on the fourth fin portions may be connected to each other along the width direction of the fourth fin portions.

Correspondingly, the present disclosure also provides another semiconductor device. An exemplary semiconductor device may be referred to FIG. 19.

The present disclosure also provides another method for forming a semiconductor device. Comparing with previous embodiments, the major differences may include followings.

The first fin portions may be etched to form third fin portions from the first fin portions. The top surfaces of the third fin portions may be lower, or level with the top surfaces of the isolation structures; and a plurality of third fin portions may form a third fin portion group. Further, the second fin portions may be etched to form fourth fin portions from the second fin portions. Top surfaces of the fourth fin portions may be lower than, or level with the top surfaces of the isolation structures, and a plurality of fourth fin portions may form a fourth fin portions group. Further, a first type of fin sidewall spacers may be formed on portions of the surfaces of the isolation structures. The first type of fin sidewall spacers may be formed on two side surfaces of the third fin portions along the width direction of the third fin portions, and one the two side surfaces of the fourth fin portions along the width direction of the fourth fin portions. Then, first doped layers and second doped layers may be formed. In particular, in one embodiment, the sidewall spacer material layer may be subjected to a differential process to form the first type of fin sidewall spacers. The first fin portions may be etched to form third fin portions; the second fin portions may be etched to form fourth fin portions; and the differential process may be different from that of the previous embodiments.

Figure 20:
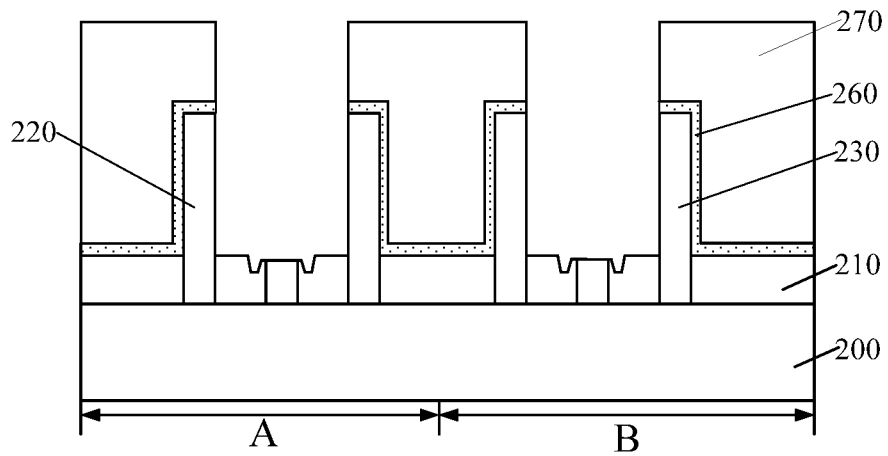
FIGS. 20-24 illustrate structures corresponding to certain stages during another exemplary fabrication process of a semiconductor device consistent with various disclosed embodiments.

FIGS. 20-24 illustrate semiconductor structures corresponding to certain stages during another exemplary fabrication process of a semiconductor device consistent with various disclosed embodiments. FIG. 20 illustrates a structure based on FIG. 7.

As shown in FIG. 20, the first middle fin portions and the second middle fin portions may be etched using the first mask layer 270 as a mask to form third middle fin portions from the first middle fin portions; and form fourth middle fin portions from the second middle fin portions. During etching the first middle fin portions and the second middle fin portions using the first mask layer 270 as the etching mask, the sidewall spacer material layer 260 may also be etched using the first mask layer 270 as a mask to remove the portions of the sidewall spacer material layer 260 between the adjacent first edge fin portions along the width direction of the first fin portions, and portions of the sidewall spacer material layer 260 between the adjacent second edge fin portions along the width direction of the second edge fin portions.

The portions of the first middle fin portions higher than top surfaces of the isolation structures 210 may be etched away to form third middle fin portions. The top surfaces of the third middle fin portions may be lower than or level with the top surfaces of the isolation structures 210. The portions of the second middle fin portions higher than top surfaces of the isolation structure 210 may be etched away to form fourth middle fin portions. The top surfaces of the fourth middle fin portions may be lower or level with the top surfaces of the isolation structures 210.

Figure 21:
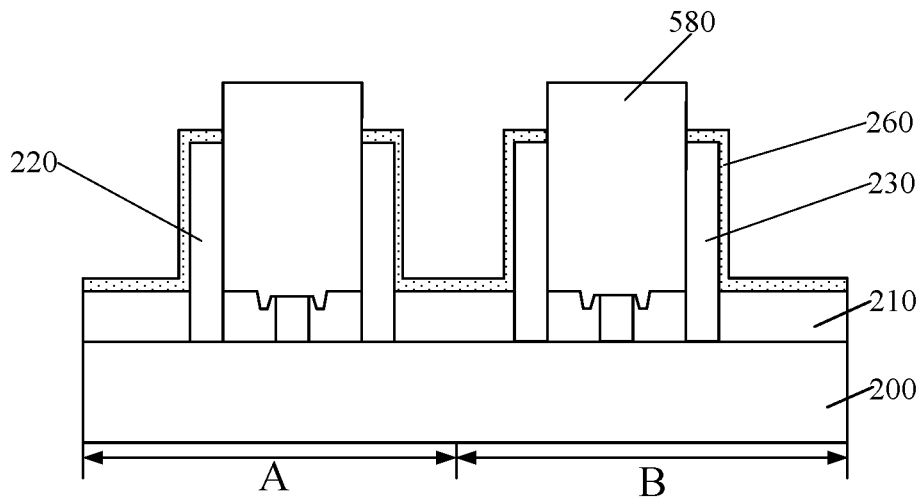

Further, as shown in FIG. 21, the first mask layer 270 may be removed (referring to FIG. 20). After removing the first mask layer 270, a second mask 580 may be formed on the isolation structures 210, the third middle fin portions, and the fourth middle fin portions. The second mask layer 580 may expose the sidewall spacer material layer 260 formed on the sidewall surfaces of the first edge fin portions facing away from the third middle fin portions, and the sidewall spacer material layer 260 on the top surfaces of the first edge fin portions, the sidewall spacer material layer 260 on the sidewall surfaces of the second edge fin portions facing away from the fourth middle fin portions, and the sidewall spacer material layer 260 on the top surfaces of the second edge fin portions. The second mask layer 580 may be a photoresist layer.

Figure 22:
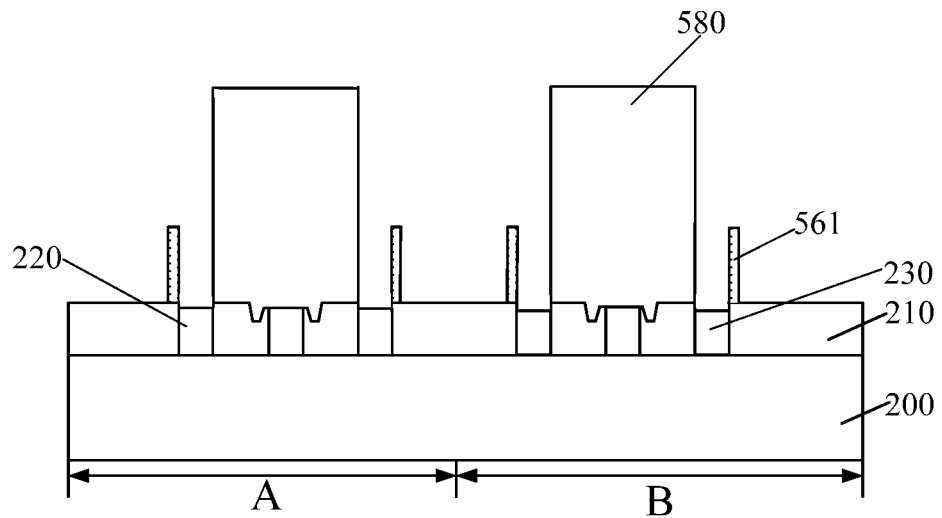

Further, as shown in FIG. 22, the first edge fin portions and the second edge fin portions may be etched using the second mask layer 580 as a mask to form third edge fin portions from the first edge fin portions, and form fourth edge fin portions from the second edge fin portions. During etching the first edge fin portions and the second edge fin portions using the second mask layer 580 as a mask, the sidewall spacer material layer 260 may be etched using the second mask layer 580 as a mask to form a first type of fin sidewall spacers 561 from the sidewall spacer material layer 260 on the sidewall surfaces of the first edge fin portions facing away from the third middle fin portions and on the sidewall surfaces of the second edge fin portions facing away from the fourth middle fin portions.

The process for etching the first edge fin portions and the second edge fin portions using the second mask layer 580 as a mask may include an anisotropic dry etching process, etc. The process for etching the sidewall spacer material layer 260 using the second mask layer 580 as a mask may include an anisotropic dry etching process, etc.

Portions of the first edge fin portions that is higher than top surfaces of the isolation structures 210 may be etched away to form third edge fin portions. Accordingly, the top surfaces of the third edge fin portions may be lower than or level with the top surfaces of the isolation structures 210. Portions of the second edge fin portions that is higher than the top surfaces of the isolation structures 210 may be etched away to form fourth edge fin portions. Accordingly, the top surfaces of the fourth edge fins may be lower than or level with the top surfaces of the isolation structures 210.

The first type of fin sidewall spacers 561 may be respectively formed on the surfaces of portions of the isolation structures 210 at the two sides of the third fin portion group along the width direction of the third fin portions. The first type of fin sidewall spacers 561 may also be formed on portions of the surfaces of the isolation structures 210 at both sides of the fourth fin portion group along the width direction of the fourth fin portions.

In one embodiment, the first type of fin sidewall spacers 561 may also be formed on the surfaces of the isolation structures 210 at the sides of the third edge fin portions facing away from the third middle fin portions. The first type of fin sidewall spacers 561 may also be formed on the surfaces of the isolation structures 210 at the sides of the fourth edge fin portions facing away from the fourth middle fin portions.

Figure 23:
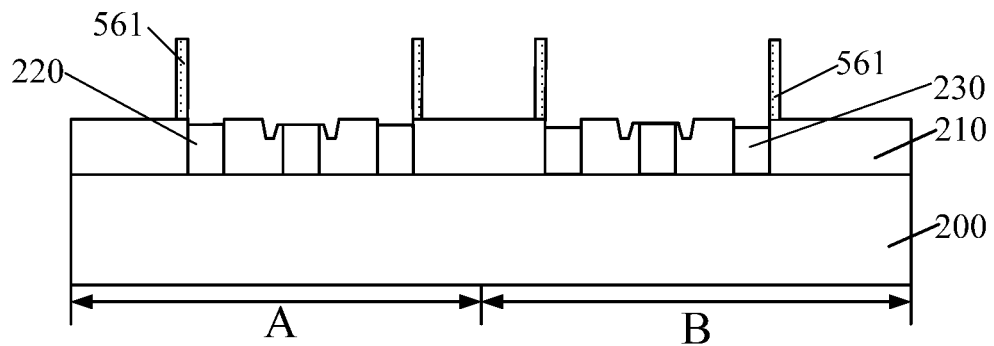

Further, as shown in FIG. 23, after forming the first type of fin sidewall spacers 461, the third edge fin portions, and the fourth edge fin portions, the second mask layer 480 may be removed (refer to FIG. 22).

Figure 24:
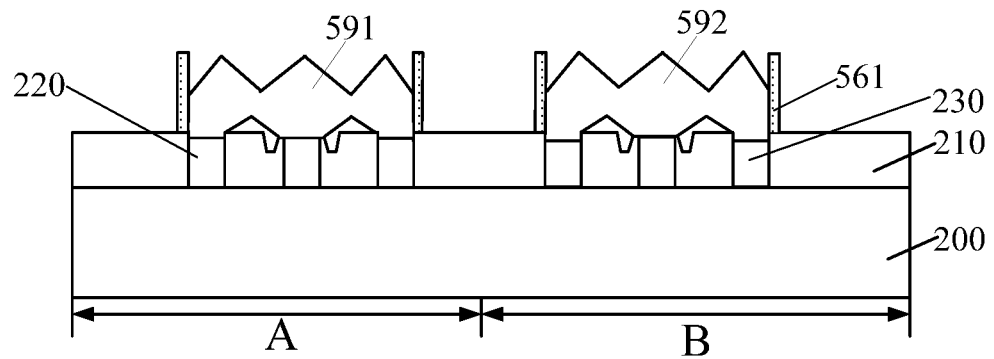

Then, as shown in FIG. 24, first doped layers 591 may be formed between the first type of fin sidewall spacers 561 in the first region A; and the first doped layers 591 may also be formed on the third fin portion group. During forming the first doped layers 591, second doped layers 592 may be formed between the first type of fin sidewall spacers 561 in the second region B; and the second doped layers 592 may be formed on the fourth fin portions. The first doped layers 591 on the third fin portions may be connected to each other along the width direction of the third fin portions; and the second doped layers 592 on the fourth fin portions may be connected to each other along the width direction of the fourth fin portions.

The present disclosure provides another semiconductor device. FIG. 24 illustrates an exemplary semiconductor device consistent with various disclosed embodiments.

As shown in FIG. 24, the semiconductor device may include a semiconductor substrate 200 having a first region A and an adjacent second region B. A plurality of first fins 220 may be formed on the first region A of the semiconductor substrate 200; and each of the first fins 220 may include a third fin region; and the plurality of third fin portions may form a third fin portion group. Further, a plurality of second fins 230 may be formed on the second region B of the semiconductor substrate 200; and each of the second fins 230 may include a fourth fin portion; and the plurality of fourth fin portions may form a fourth fin group. Further, the semiconductor device may include isolation structures 210 formed in the first region A and the second region B of the semiconductor substrate 200. The isolation structures 210 may cover the entire sidewall surfaces of the third fin portions and the entire sidewall surfaces of the fourth fin portions. Further, the semiconductor device may include a first type of fin sidewall spacers 561 on the two sidewall surfaces of the third fin portion group along the width direction of the third fin portions and the two sidewall surfaces of the fourth fin portion group along the width direction of the fourth fin portions. Further, the semiconductor device may include first doped layers 591 formed between the first type of fin sidewall spacers 561 in the first region A. The first doped layers 591 may be formed on the third fin portion group; and the first doped layers 591 on the third fin portions may be connected to each other along the width direction of the third fin portions. Further, the semiconductor device may include second doped layers 592 formed between the adjacent first type of fin sidewall spacers 561 in the second region B. The second doped layers 592 may be formed on the fourth fin portion group; and the second doped layers 592 on the fourth fin portions may be connected to each other along the width direction of the fourth fin portions. The detailed structures and intermediate structures are described above with respect to the fabrication processes.

The present disclosure also provides another method for forming a semiconductor device. Comparing with the previous embodiments, the major differences may include the processes for etching the first fin portions to form third fin portions and etching the second fin portions to form fourth fin portions and the differential process.

Figure 25:
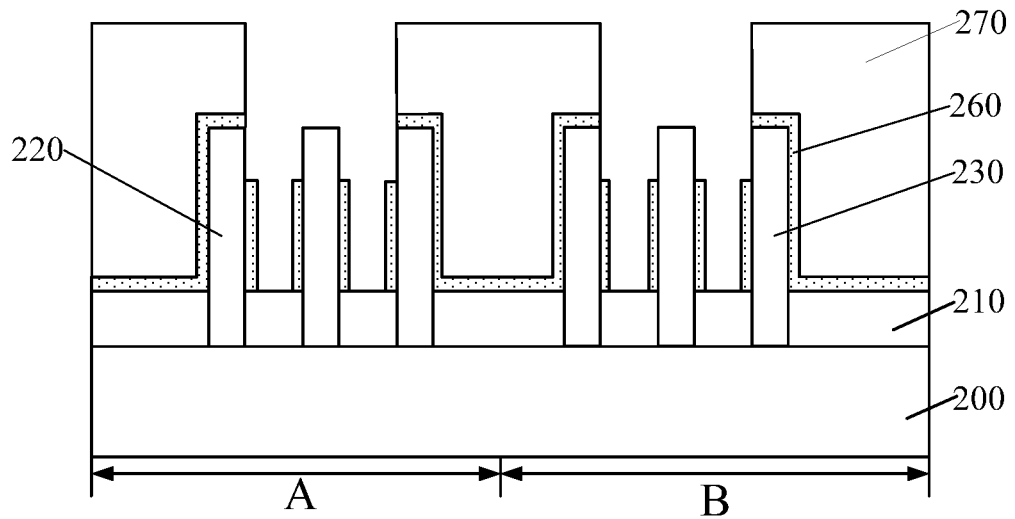
FIGS. 25-26 illustrate structures corresponding to certain stages during another exemplary fabrication process of a semiconductor device consistent with various disclosed embodiments.
Figure 26:
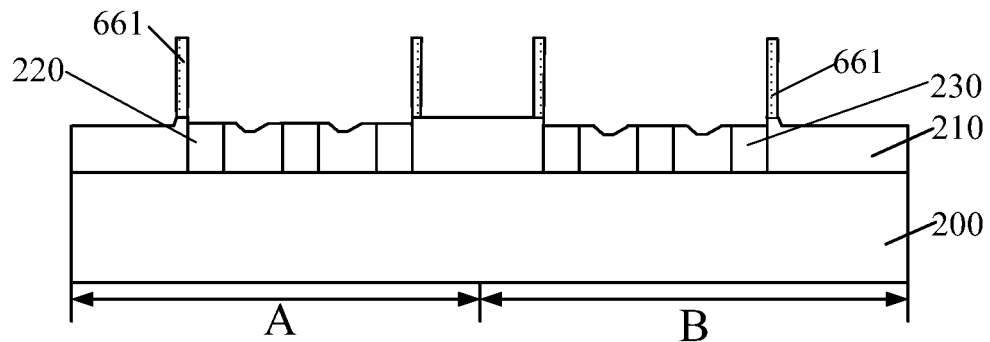

FIGS. 25-26 illustrate structures during another exemplary process for forming a semiconductor device. FIG. 25 illustrates a structure based on FIG. 7.

As shown in FIG. 25, the sidewall spacer material layer 260 may be etched using the first mask layer 270 as a mask such that the top surface of the sidewall spacer material layer 260 between the first edge fin portions along the width direction of the first fin portions may be lower than the top surfaces of the first middle fin portions. Further, the top surface of the sidewall spacer material layer 260 between the second edge fin portions along the width direction of the second fin portions may be lower than the top surfaces of the second middle fin portions.

The process for etching the sidewall material layer 260 using the first mask layer 270 as a mask may include an anisotropic dry etching process. During the etching process, the etching rate to the sidewall material layer 260 may be greater than the etching rate of the first middle fin portions and the second middle fin portions. In particular, the etching selectivity ratio may be greater than approximately 100. Accordingly, the consumption of the etching process to the first middle fin portions and the second middle fin portions may be substantially small and, after the etching process, the heights of third fin portions may be uniform; and the heights of the fourth fin portion may be uniform.

Further, as shown in FIG. 26, after the etching process, the first mask layer 270 may be removed. After removing the first mask layer 270, the first fin portions and the second fin portions may be etched to form third fin portions from the first fin portions; and form fourth fin portions from the second fin portions. After removing the first mask layer 270 and during the process for etching the first fin portions and the second fin portions, the remaining sidewall spacer material layer 260 may be etched to remove portions of the sidewall material layer 260 between the first edge fin portions along the width direction of the first fin portions and the portions of the sidewall spacer material layer 260 between the second edge fin portions along the width direction of the second fin portions to form a first type of fin sidewall spacers 661.

The process for etching the first fin portions and the second fin portions may include an anisotropic dry etching process. The process for etching the remaining sidewall material layer 260 may include an anisotropic dry etching process.

In one embodiment, the process for etching the first fin portions and the second fin portions and the process for etching the remaining sidewall spacer material layer 260 may be performed in one etching process. Thus, the process step may be simplified. The etching rate to the sidewall spacer material layer 260 may be smaller than the etching rate to the first fin portions and the second fin portions.

The positions of the first type of fin sidewall spacers 661 may be referred to the previous embodiments.

After forming the first type of fin sidewall spacers 661, first doped layers and second doped layers may be formed. The positions of the first doped layers and the positions of the second doped layers may be referred to the previous embodiments.

Correspondingly, the present disclosure also provides another semiconductor device. The semiconductor device may be referred to the previous embodiments.

The present disclosure also provides another method for forming a semiconductor device. Comparing with the previous embodiments, the major differences may include the process for etching the first fin portions to form third fin portions and etching the second fin portions to form the fourth fin portions and the differential process.

Figure 27:
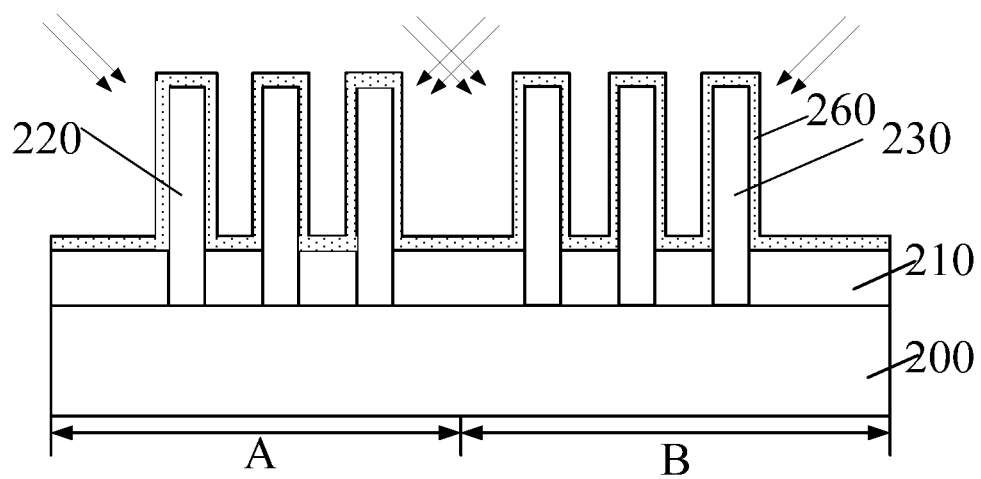

FIGS. 27-28 illustrate semiconductor structures corresponding to certain stages during an exemplary process for forming a semiconductor device consistent with various disclosed embodiments. FIG. 27 illustrates a structure based on FIG. 5.

As shown in FIG. 5, an ion implantation process may be performed on the sidewall spacer material layer 260 at two sidewall surfaces of the first fin portion group along the width direction of the first fin portions and the sidewall spacer material layer 260 at the two sidewall surfaces of the second fin portion group along the width direction of the second fin portions.

The ion implantation may be referred to the ion implantation process described in FIG. 17.

Further, as shown in FIG. 28, after the ion implantation, the sidewall spacer material layer 260 may be etched. The etching rate to the region of the sidewall material layer 260 implanted with the ions may be smaller than the etching rate to the region without being implanted with the ions. Accordingly, the portions of the sidewall spacer material layer 260 between the first edge fin portions along the width direction of the first fin portions and the portions of the sidewall spacer material layer 260 between the second edge fin portions along the width direction of the second fin portions may be removed; and a first type of fin sidewall spacers 761 may be formed. After the ion implantation process and during the process for etching the sidewall spacer material layer 260, the first fin portions and the second fin portions may be etched to form third fin portions from the first fin portions and form the fourth fin portions from the second fin portions.

The positions of the first type of fin sidewall spacers 761 may be referred to the previous embodiments.

After forming the third fin portions and the fourth fin portions, first doped layers and second doped layers may be formed. The positions of the first doped layers and the second doped layer may be referred to the previous embodiments.

Correspondingly, the present disclosure also provides another semiconductor device. The semiconductor device may be referred to the previous embodiments.

In the method for forming a semiconductor device provided by the present disclosure, the top surfaces of the second type of fin sidewall spacers may be lower than the top surfaces of the first type of fin sidewall spacers. Thus, in the first region, the blocking effect of the second sidewall spacers to the growth of the first doped layers may be substantially small. Accordingly, it may facilitate that the first doped layers may be connected to each other along the width direction of the third fin portions. In the second region, the blocking effect of the second type of fin sidewall spacers to the growth of the second doped layers may be substantially small. Thus, it may facilitate that the second doped layers may be connected to each other along the width direction of the fourth fin portions.

In the present disclosure, a first type of fin sidewall spacers may be formed. The first type of fin sidewall spacers may be respectively formed on both sidewall surfaces of the third fin portion group along the width direction of the third fin portions, and the sidewall surfaces of the fourth fin portion group along the width direction of the fourth fin portions. Because the top surfaces of the first type of fin sidewall spacers may be higher than the top surfaces of the second type of fin sidewall spacers, and higher than the top surfaces of the third fin portions and the fourth fin portions, when forming the first doped layers and the second doped layers, the first type of fin sidewall spacers in the first region may limit the growth space of the first doped layers; and the first type of fin sidewall spacers in the second region may limit the growth space of the second doped layers. Accordingly, the first type of fin sidewall spacers having a larger height may separate the first doped layers from the second doped layers to prevent the first doped layers and the second doped layers from being connected together. Thus, the performance of the semiconductor device may be improved.

Secondly, because the first type of fin sidewall spacers in the first region may limit the growth space of the first doped layers, the first doped layers may be uniformly formed along the width direction of the third fin portions. Thus, the insufficient growth of the first doped layers on the middle fin portions along the width direction of the third fin portions may be avoided. Accordingly, the first doped layers may be uniformly distributed along the width direction of the third fin portions. Further, because the first type of fin sidewall spacers in the second region may limit the growth space of the second doped layers, the second doped layers may be uniformly formed along the width direction of the fourth fin portions. Thus, the insufficient growth of the second doped layers on the middle fin portions along the width direction of the fourth fin portions may be avoided. Accordingly, the second doped layers may be uniformly distributed along the width direction of the fourth fin portions In the semiconductor device provided by the present disclosure, the first doped layers and the second doped layers may be separated by a first type of fin sidewall spacers having a larger height. Thus, the connection between the first doped layers and the second doped layers may be avoided. Accordingly, the performance of the semiconductor device is improved.

In the method for forming a semiconductor device provided by the present disclosure, the top surfaces of the isolation structures may be lower than the top surfaces of the first type of fin sidewall spacers. Thus, in the first region, the blocking effect of the isolation structures to the growth of the first doped layers may be substantially small; and it may facilitate that the first doped layers may be connected to each other along the width direction of the third fin portions. Further, in the second region, the isolation structures may have a smaller blocking effect on the growth of the second doped layers; and it may facilitate that the second doped layers may be connected to each other along the width direction of the fourth fin portions.

In the present disclosure, a first type of fin sidewall spacers may be formed. The first type of fin sidewall spacers may be respectively formed on both side surfaces of the third fin portion group along the width direction of the third fin portions, and on the both side surfaces of the fourth fin portion group along the width direction of the fourth fin portions. Further, the top surfaces of the first type of fin sidewall spacers may be higher than the top surfaces of the isolation structures. Thus, during the process for forming the first doped layers and the second doped layers, the first type of fin sidewall spacers having the larger height may separate the first doped layers from the second doped layers to prevent the first doped layer and the second doped layer from being connected together. Accordingly, the performance of the semiconductor device may be improved.

In the semiconductor device provided by the present disclosure, the first doped layers and the second doped layers may be separated by the first type of fin sidewall spacers having a larger height. Thus, the connection between the first doped layers and the second doped layers may be avoided. Accordingly, the performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising:
   a semiconductor substrate having a first region and an adjacent second region;
   a plurality of adjacent first fins in the first region of the semiconductor substrate, wherein each first fin contains a third fin portion and a plurality of third fin portions form a third fin portion group;
   a plurality of adjacent second fins in the second region of the semiconductor substrate, wherein each second fin contains a fourth fin portion and a plurality of fourth fin portions form a fourth fin portion group;
   a first type of fin sidewall spacers formed on two sidewall surfaces of the third fin portion group along a width direction of the third fin portions and on two sidewall surfaces of the fourth fin portion group along a width direction of the fourth fin portions;
   a second type of fin sidewall spacers formed between adjacent third fin portions and on sidewall surfaces of the third fin portions along the width direction of the third fin portions, and between adjacent fourth fin portions and on sidewall surfaces of the fourth fin portions along the width direction of the fourth fin portions;
   first doped layers formed between adjacent first type of fin sidewall spacers in the first region, on the third fin portion group and the second type of fin sidewall spacers in the first region, wherein the first doped layers on the third fin portions in the first region are connected to each other along the width direction of the third fin portions and confined by two vertical planes, each of the two vertical planes is shared with a corresponding sidewall surface of the adjacent first type of fin sidewall spacers and a corresponding sidewall surface of the third fin portion group in the first region; and second doped layers formed between adjacent first type of fin sidewall spacers in the second region, and on the fourth fin portion group and the second type of fin sidewall spacers in the second region, wherein the second doped layers on the fourth fin portions are connected to each other along the width direction of the fourth fin portions and confined between the adjacent first type of fin sidewall spacers in the second region.

2. The semiconductor device according to claim 1, further comprising:

isolation structures formed on the first region and the second region of the semiconductor substrate and covering entire sidewall surfaces of the third fin portions and entire sidewall surfaces of the fourth fin portions.

3. The semiconductor device according to claim 2, wherein:

the isolation structures have top surfaces higher than a top surface of each first fin, and the top surfaces of the isolation structures are higher than a top surface of each second fin.

4. The semiconductor device according to claim 2, wherein:

the first type of fin sidewall spacers and the second type of fin sidewall spacers are formed on surfaces of the isolation structures.

5. The semiconductor device according to claim 1, wherein:

a distance between top surfaces of the first type of fin sidewall spacers and a top surface of the third fin group is in a range of approximately 2 nm-30 nm; and a distance between the top surfaces of the first type of fin sidewall spacers and a top surface of the fourth fin group is in a range of approximately 2 nm-30 nm.

6. The semiconductor device according to claim 1, wherein:

top surfaces of the second type of fin sidewall spacers level with or are lower than a top surface of the third fin group; and top surfaces of the second type of fin sidewall spacers level with or are lower than a top surfaces of the fourth fin group.

7. The semiconductor device according to claim 1, further comprising:

a first gate structure across the plurality of adjacent first fins in the first region, and a second gate structure across the plurality of adjacent second fins in the second region.

8. The semiconductor device according to claim 7, wherein:

the third fin portions are located at two sides of the first gate structure, and the fourth fin portions are located at two sides of the second gate structure.

* * * * *